United States Patent [19]

Ueno et al.

[11] Patent Number: 4,727,517
[45] Date of Patent: Feb. 23, 1988

[54] SEMICONDUCTOR MEMORY WITH COLUMN LINE VOLTAGE SITTING CIRCUIT

[75] Inventors: Masahiro Ueno; Kozaburo Kurita; Masahiro Iwamura; Hideo Maejima; Ikuro Masuda, all of Hitachi; Tetsuo Nakano, Ome, all of Japan

[73] Assignee: Hitachi, Ltd., Tokyo, Japan

[21] Appl. No.: 785,654

[22] Filed: Oct. 9, 1985

[30] Foreign Application Priority Data

Oct. 11, 1984 [JP] Japan .................................. 59-211338
Mar. 27, 1985 [JP] Japan .................................. 60-62755

[51] Int. Cl.$^4$ .............................................. G11C 7/00
[52] U.S. Cl. ..................................... 365/203; 365/177; 365/104; 365/208
[58] Field of Search ................. 365/203, 104, 94, 103, 365/205, 207, 208, 177, 190; 307/530

[56] References Cited

U.S. PATENT DOCUMENTS

| | | | |
|---|---|---|---|
| 3,849,673 | 11/1974 | Koo | 365/203 |
| 4,185,321 | 1/1980 | Iwahashi et al. | 365/204 |
| 4,318,014 | 3/1982 | McAlister et al. | 365/104 |
| 4,456,979 | 6/1984 | Isogai | 365/190 |
| 4,482,824 | 11/1984 | Tzeng | 365/104 |

FOREIGN PATENT DOCUMENTS 0003792  1/1984 Japan .................................. 365/104

Primary Examiner—Stuart N. Hecker
Assistant Examiner—Glenn A. Gossage
Attorney, Agent, or Firm—Antonelli, Terry & Wands

[57] ABSTRACT

A semiconductor memory is provided including a plurality of row lines, memory cells driven by selecting a row line, sense amplifiers connected to the memory cells via column lines, and a column line voltage setting circuit for setting a predetermined voltage on the column lines. The predetermined voltage is defined by a voltage necessary to activate semiconductor switch elements constituting the column line voltage setting circuit, and is made nearly equal to the threshold voltage of the sense amplifiers. Thus, a high-speed, low power consumption semiconductor memory can be realized.

12 Claims, 25 Drawing Figures

SEMICONDUCTOR MEMORY WITH COLUMN LINE VOLTAGE SITTING CIRCUIT

BACKGROUND OF THE INVENTION

In a ROM (Read Only Memory), switching devices such as MOS transistors are provided at intersections of row lines and column lines to store information as either a "1" or "0". As the integration density of such a ROM becomes higher, the impedance within the circuit also becomes higher, resulting in an increased parasitic capacitance. Accordingly, it is difficult to attain a higher speed together with a lower power consumption.

A high-speed readout technique for such a ROM was disclosed in Japanese Examined Patent Publication No. 46797/83 published on Oct. 18, 1983, for example. In accordance with this disclosed technique, a MOS transistor for precharging a column (X) line is provided between the column line and the power supply. When a change occurs in the address signal, a precharge signal having a constant duration is applied to the gate of such a MOS transistor to precharge the column line at a high speed. In driving a row line, it is pulled up only by a MOS transistor of depletion type which has a high impedance and which always stays in the conduction state. Accordingly, the operation of the MOS transistor comprising a memory cell for discharging the electronic charge is not hampered.

The maximum voltage on the column line of the above described prior art is the potential on the column (Y) line when row (X) lines which do not form memory cells are continuously selected. This voltage is nearly equal to the power supply voltage. And the lowest voltage on such a column (Y) line is low enough to be detected by a sense circuit. Since both precharge and discharge are monitored in the form of time, the voltage magnitude must have a sufficient allowance and it usually exceeds half of the power supply voltage. The voltage amplitude of the Y line is nearly half of the power supply voltage.

SUMMARY OF THE INVENTION

An object of the present invention is to provide a semiconductor memory of high speed and low power consumption.

In accordance with the first feature of the present invention, a column line voltage setting circuit having a column line setting voltage defined by a function of activation voltage peculiar to a semiconductor switch element is provided, and a sense amplifier having, threshold voltage which is nearly equal to the column line setting voltage is also provided. The above described activation voltage is the minimum voltage to be applied to the control terminal of a semiconductor switch element to turn it on. For example, it is the base emitter voltage ($V_{BE}$) of a bipolar transistor or threshold voltage ($V_{TH}$) of a MOS transistor. Hence, the activation voltage is relatively low and stable.

In accordance with the second feature of the present invention, the semiconductor memory comprises a plurality of row lines, memory cells connected to the row lines and driven by selecting a row line, sense amplifiers connected to the memory cells via column lines, the sense amplifier including a first transistor, the reference electrode of the first transistor being directly or indirectly connected to the column line, the control electrode of the first transistor being connected to the sense amplifier bias circuit, and a precharge circuit for charging the parasitic capacitance on the column line to a predetermined voltage, the precharge circuit including a second transistor, the reference electrode and control electrode of the precharge circuit being respectively connected to the column line and a column line voltage setting circuit, the output voltage of the sense amplifier bias circuit being nearly equal to that of the column line voltage setting circuit.

By using bipolar transistors as the above described first and second transistors, their large mutual conductance (hereafter referred to as gm) and high drive capability can be utilized. In addition, high integration density of field effect type transistors (hereafter referred to as MOS transistors) is preferably combined.

Other objects and features of the present invention will be apparent from the following description of embodiments.

DESCRIPTION OF THE PREFERRED EMBODIMENTS

Figure 1:
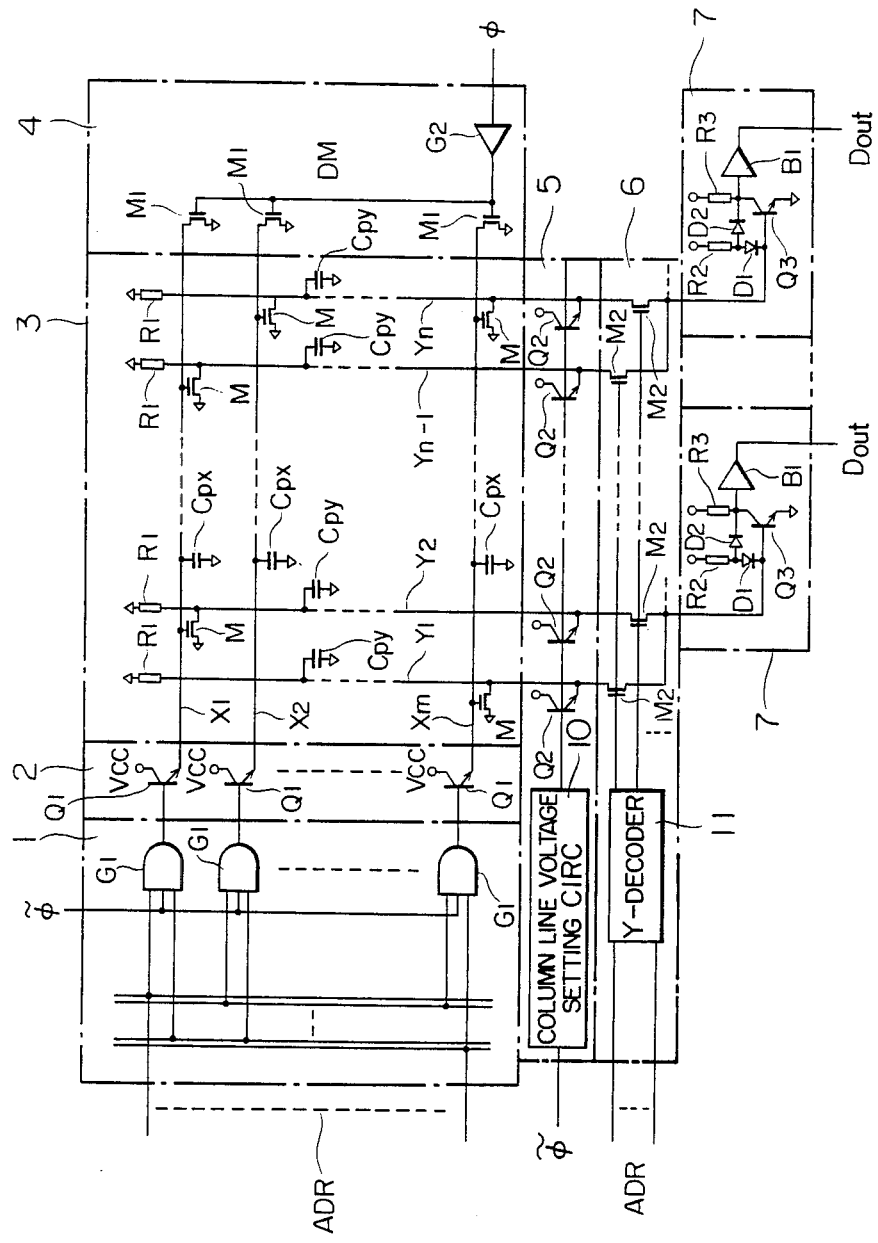
FIG. 1 shows a circuit diagram of an embodiment of the present invention.

An embodiment of the present invention will now be described by referring to FIGS. 1 to 5. FIG. 1 shows the circuit configuration of a semiconductor memory which is an embodiment of the present invention. An X decoder 1 includes AND gates $G_1$ for producing X-line selection signals on the basis of an address signal ADR and a clock signal $\Phi$. An X driver 2 includes m NPN bipolar transistors $Q_1$ for driving row lines $X_1$ to $X_m$ with low impedance. The base, collector and emitter of the NPN transistor $Q_1$ are connected to an output of an AND gate $G_1$, the power supply potential $V_{cc}$, and one of row lines $X_1$ to $X_m$, respectively. An m-row, n-column memory cell matrix 3 includes NMOS transistors M constituting memory cells, row lines $X_1$ to $X_m$, column lines $Y_1$ to $Y_n$, and resistors $R_1$ having high resistance values for discharging the leak electronic charge stored on the column lines $Y_1$ to $Y_n$. The gate, drain and source of each memory cell transistor M are connected to one of the row lines $X_1$ to $X_m$, one of the column lines $Y_1$ to $Y_n$, and the ground potential, respectively. In an X-line discharge circuit 4, electronic charges stored across parasitic capacitance of the row lines $X_1$ to $X_m$ are rapidly discharged through m MOS transistors $M_1$. A precharge circuit 5 includes a column line voltage setting circuit 10 for setting the column line setting voltage $V_y$ which is the operation voltage of the column lines $Y_1$ to $Y_n$. The precharge circuit 5 further includes n NPN bipolar transistors $Q_2$ coupled to the column lines $Y_1$ to $Y_n$ in the emitter follower form. According to the output signal of the column line voltage setting circuit 10, the NPN bipolar transistors $Q_2$ rapidly charge the parasitic capacitance of the column lines $Y_1$ to $Y_n$ up to the column line setting voltage $V_y$. In a Y selector 6, a Y-line signal from a Y decoder 11 selects a plurality of lines out of a group of column lines $Y_1$ to $Y_n$ via switching MOS transistors $M_2$. A sense amplifier 7 includes an NPN bipolar transistor $Q_3$ having an emitter coupled to the ground, resistors $R_2$ and $R_3$, diodes $D_1$ and $D_2$, and a sense amplifier $B_1$. One sense amplifier 7 is connected to a plurality of column lines via MOS transistors $M_2$.

Figure 2:
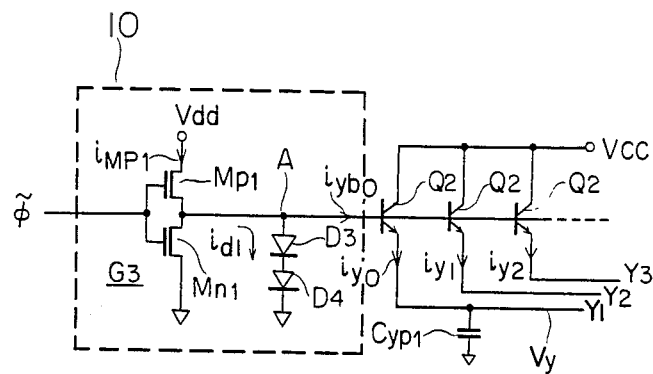
FIG. 2 shows the configuration of a column line voltage setting circuit shown in FIG. 1.

FIG. 2 shows an embodiment of the column line voltage setting circuit 10 illustrated in FIG. 1. In FIG. 2, a P-type MOS transistor $M_{p1}$ and an N-type MOS transistor $M_{n1}$ supply base currents of all of the NPN transistors $Q_2$ which in turn supply the charging currents to the column lines. In addition, the MOS transistors $M_{p1}$ and $M_{n1}$ constitute an inverter gate. The circuit 10 is controlled by a clock signal $\bar{\Phi}$. When $\bar{\Phi}$ assumes its L level, a bias current $id_1$ flows through the PMOS transistor $M_{p1}$ and diodes $D_3$ and $D_4$. Then the base of each NPN transistor $Q_2$ is biased to approximately $2V_{BE}$ which is twice the base-emitter voltage. Since the parasitic capacitance $C_{yp1}$ of the column lines $Y_1$ to $Y_n$ is charged by emitter currents $i_{y0}$ to $i_{yn-1}$ of NPN transistors $Q_2$, which constitute emitter followers, the charge voltage of the parasitic capacitance $C_{yp1}$ becomes up to the voltage of $1\,V_{BE}$ which is lower than the base voltage $2\,V_{BE}$ of the NPN transistor $Q_2$ by $1\,V_{BE}$. Therefore, the voltage of $1\,V_{BE}$ becomes the operation voltage of the column lines $Y_1$ and $Y_n$. That is to say, the precharge circuit 5 forms a voltage supply having a low output impedance, and the column line voltage setting circuit 10 sets the voltage of the column lines to $V_{BE}$.

The sense amplifier 7 of FIG. 1 is a common emitter amplifier. A bias current is supplied to the base of each NPN transistor $Q_3$ through a resistor $R_2$ and a diode $D_1$. The base-emitter voltage $V_{BE}$ of the bipolar transistor $Q_3$ can then be expressed as $$V_{BE} = \frac{kT}{q} \ln \frac{I \cdot E}{I_{ES}}, \tag{1}$$

where k is Boltzmann constant, T absolute temperature, $I_E$ emitter current, $I_{ES}$ reverse saturation current, and $kT/q = V_T$ is approximately 26 mV at room temperature. Assuming that the current amplification factor is $\beta$, the collector current $I_c$ can be related to the base current $I_B$ as $$I_E = I_C = \beta I_B. \tag{2}$$

The mutual conductance gm between the base-emitter voltage $V_{BE}$ and the collector current $I_c$ can be represented as $$g_m = \frac{qI_c}{kT} = 40 \; mA/V. \tag{3}$$

Equation (1) can be rewritten as $$I_E = I_{ES}(e^{\frac{qV_{BE}}{kT}} - 1). \tag{4}$$

From the foregoing description, the base-emitter voltage $V_{BE}$ of the bipolar transistor generally assumes a value of 0.6 to 0.8 V and exhibits good uniformity on an LSI (large scale integrated circuit). For example, a change in the base-emitter voltage $V_{BE}$ corresponding to a change of 1 mA in the collector current $i_c$ is 25 mV. That is to say, the base-emitter voltage $V_{BE}$ exhibits good constant voltage characteristics. In other words, assuming that the current amplification factor $\beta$ is 100, the above described change in the collector current $I_c$ and that in the base-emitter voltage $V_{BE}$ corresponds to a change of 10 $\mu$A in the base current $I_B$.

Accordingly, the bias current $i_b$ applied to the base of the NPN transistor $Q_3$ in the sense amplifier 7 produces the base-emitter voltage $V_{BE}$ to let flow the collector current $i_c$. If the above described bias current $i_b$ is so chosen as to turn on the NPN transistor $Q_3$, the output data $D_{out}$ turns to its "L" level. If an X selector and Y selector are then activated to turn on a memory cell transistor M coupled to the sense amplifier 7, a part of the above described base bias current $i_b$ is diverted to the MOS transistor M of the memory cell. If the base current of the NPN transistor $Q_3$ in the sense amplifier 7 is thus reduced by 10 $\mu$A, for example, the collector current changes by 1 mA, as is evident from the foregoing description. As a result, the output $D_{out}$ of the sense amplifier turns to its "H" level. At this time, the change in the base-emitter voltage $V_{BE}$ is 25 mV, and the threshold voltage $V_{st}$ of the sense amplifier 7 can be said to be $1\,V_{BE}$.

Figure 3:
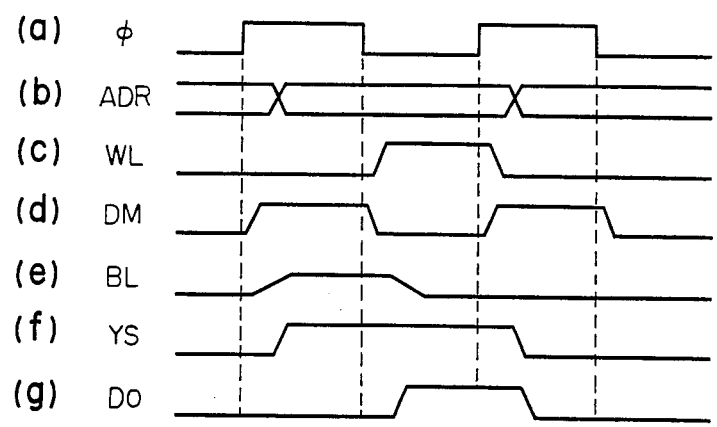
FIG. 3 shows a time chart of the circuit illustrated in FIG. 1.

The operation of the memory circuit illustrated in FIGS. 1 and 2 will now be described by referring to FIG. 3. When the address signal ADR is applied to the memory circuit in synchronism with the clock $\Phi$, the column line voltage setting circuit 10 is driven. That is to say, the PMOS transistor $M_{p1}$ illustrated in FIG. 2 turns on. And the base voltage which has been adjusted to $2\,V_{BE}$ is applied to the base of the NPN transistor $Q_2$ included in the precharge circuit 5. As a result, the parasitic capacitance $C_{yp}$ of the Y line is charged up to the column line setting voltage $V_y = V_{BE}$. The potential at the column line rises as shown in waveform (e) of FIG. 3. At the same time, the Y decoder output is issued as illustrated in waveform (f) of FIG. 3. The MOS transistors $M_2$ for the Y selector are turned on at the rate of one per group to directly couple the column lines $Y_1$ to $Y_n$ to the sense amplifiers 7. As described above, both the column line setting voltage $V_y$ and the threshold voltage $V_{st}$ are $1\,V_{BE}$. Due to the difference between these two circuits in bias current, for example, however, a slight difference may be incurred between these two voltage values. When the MOS transistor $M_2$ for the Y selector turns on, the charge current or the discharge current flows between the parasitic capacitance $C_{py}$ and the resistor $R_2$ of the sense amplifier 7 or the base of the NPN transistor $Q_3$, the differential voltage being eliminated. By the $\overline{\Phi}$ signal which appears during the "L" period of the clock $\Phi$, an X-line drive signal WL, which is an AND signal of the X decoder output and $\overline{\Phi}$, is sent out as illustrated in waveform (c) of FIG. 3. Thus, only one of the row lines $X_1$ to $X_m$ is driven to its "H" level. If at this time a memory transistor M is present between the driven row line and the selected column line, the electronic charge of the column line is discharged through the MOS transistor M to lower the potential BL of the column line as illustrated in waveform (e) of FIG. 3. When this has been detected, i.e., when the potential of the column line has reached the Y line setting voltage $V_y$ minus 25 mV in the above described example, the sense amplifier 7 sends out an output signal $D_o$ of "H" level as illustrated in waveform (g) of FIG. 3. The discharge circuit 4 is provided for, during the period of the clock $\Phi$, discharging the electronic charge stored across the parasitic capacitance $C_{px}$ of the row line when the row line is driven. The MOS transistors $M_1$ connected to all of the row lines $X_1$ to $X_m$ are driven as illustrated in waveform (d) of FIG. 3 to return the potential of the row lines $X_1$ to $X_m$ to the "L" level.

It is evident from the above description that in this embodiment the parasitic capacitance $C_{py}$ of the column line $Y_1$ to $Y_n$ is stably and rapidly charged to a low voltage value of $V_c = 1 V_{BE}$ (0.6 to 0.8 V) by the precharge circuit including the column line voltage setting circuit 10. Assuming that the total parasitic capacitance of the column line $C_{pyt} = 2$ nF, charging voltage $V_{cl} = 0.7$ V, and the operation frequency is 10 MHz, the dissipated power in the present embodiment is 70 mW, which is sufficiently low as compared with the prior art.

The column line setting voltage $V_y$ is set nearly equal to the threshold voltage $V_{st}$ of the sense amplifier 7. When the MOS transistor M for the memory cell begins to discharge the electronic charge across the parasitic capacitance $C_{py}$ of the column line, therefore, a slight change in the potential of the column line can be rapidly detected to yield the output signal. Assuming that the parasitic capacitance $C_{py} = 4$ pF, and the drain current of the MOS transistor M is 100 μA in the above described example, it takes only 1 nsec to produce on the column lines $Y_1$ to $Y_n$ a potential change of 25 mV required for the operation of the sense amplifier 7, resulting in very rapid readout.

The precharge time can also be reduced. Assuming that the precharge current is 500 μA under the above described conditions, the precharging can be completed in approximately 5.6 nsec.

Figure 4:
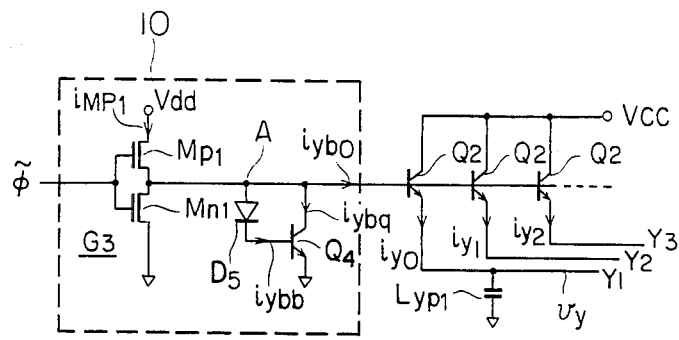
FIGS. 4 and 5 show other embodiments of the column line voltage setting circuit.

FIG. 4 shows another embodiment of the column line voltage setting circuit illustrated in FIG. 1. Reference letters in FIG. 4 that are like reference letters in FIG. 2 refer to like components. In FIG. 4, $Q_4$ denotes an NPN bipolar transistor and $D_5$ denotes a diode. The potential at a point A coupled to the base of the NPN bipolar transistor $Q_2$ is defined by the base-emitter voltage $V_{BEq4}$ of the NPN transistor $Q_4$ through which a collector current $i_{ybq}$ flows and the forward voltage drop $V_{Fd5}$ across the diode $D_5$ through which a current $i_{ybb}$ flows. And the potential at the point A is approximately $2V_{BE}$ in the same way as FIG. 2. The base current $i_{ybo}$ of the emitter follower transistors $Q_2$ included in the precharge circuit 5 is varied according to the magnitude of the load, the change rate of the potential of the column lines $Y_1$ to $Y_n$, and the like. Accordingly, the current $i_{Mp1}$ flowing through the PMOS transistor $M_{p1}$ must have a sufficient allowance with respect to its maximum value. And the difference between $i_{MP1}$ and $i_{ybo}$ is bypassed as the current $i_{d1}$ flowing through diodes $D_3$ and $D_4$ in case of FIG. 2 and as the collector current $i_{ybq}$ of the NPN transistor in case of FIG. 4. A change in the bypass current influences $V_{BE}$ defined by the equation (1) or the forward voltage drop $V_F$, and the voltage drop caused by the parasitic resistance of diodes $D_3$ and $D_4$ or the NPN transistor $Q_4$. In the embodiment of FIG. 4, the bypass current $i_{ybq}$ flows through only the NPN transistor $Q_4$ and it is reduced to half that of FIG. 2. Accordingly, the change in the column line setting voltage $V_y$ is small as compared with FIG. 2.

Figure 5:
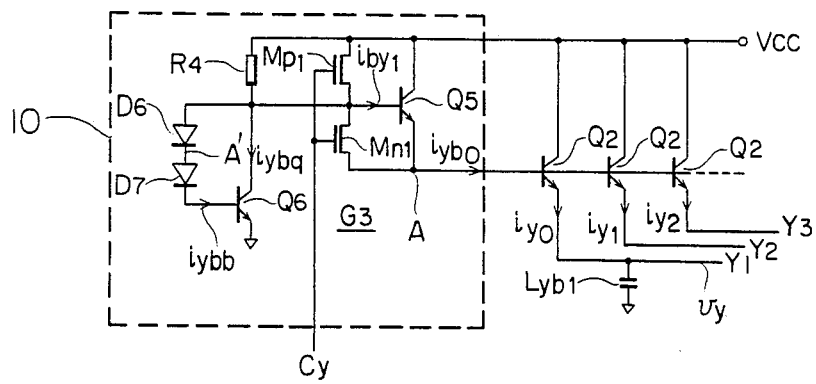

FIG. 5 shows still another embodiment of the column line voltage setting circuit 10. Reference letters in FIG. 5 that are like reference letters in FIGS. 2 and 4 refer to like components.

The circuit of FIG. 5 includes NPN transistors $Q_5$ and $Q_6$, diodes $D_6$ and $D_7$ and a resistor $R_4$. In this embodiment, the base current fed to all of the NPN transistors $Q_2$ in the precharge circuit 5 is supplied from the NPN transistor $Q_5$ constituting an emitter follower. Accordingly, the base current of the NPN transistor $Q_5$ supplied through the PMOS transistor $M_{p1}$ becomes equal to $i_{ybo}/\beta$, which has a very small value.

While the current $i_{MP1}$ flowing through the MOS transistor $M_{p1}$ is directly supplied to the bases of all NPN transistors in the embodiments of FIGS. 2 and 4, the base current $i_{ybo}$ of the NPN transistors $Q_2$ is supplied from the NPN transistor $Q_5$ in the embodiment of FIG. 5. In the embodiments of FIGS. 2 and 4, the PMOS transistor $M_{P1}$ must have correspondingly low impedance. Assuming that this impedance is $Z_{p1}$, the current $i_{MP1}$ flowing through the MOS transistor $M_{P1}$ can be represented as $$i_{MP1} = \frac{V_{dd} - 2V_{BE}}{Z_{P1}} \quad (5)$$

Excepting $i_{ybo}$ which becomes the base current of the NPN transistor $Q_2$, the current $i_{MP1}$ is bypassed to the diodes $D_3$ and $D_4$ in FIG. 2 or to the NPN transistor $Q_4$ in FIG. 4. When charging of column lines $Y_1$ to $Y_n$ has been completed, the current $i_{ybo}$ becomes zero and the entire current $i_{MP1}$ is bypassed. Meanwhile, in the embodiment of FIG. 5, the base current $i_{ybo}$ of the NPN transistor $Q_2$ is supplied from the NPN transistor $Q_5$. When charging of the parasitic capacitance of the column lines $Y_1$ to $Y_n$ has been completed, the emitter potential of the NPN transistor $Q_5$ rises up and the NPN transistor $Q_5$ turns off. The NPN transistor $Q_5$ thus performs impedance conversion and a switching function. Accordingly, the diodes $D_6$ and $D_7$ and the NPN transistor $Q_6$ included in the bias circuit for defining the base potential of the NPN transistor $Q_5$ operate with a high impedance. Since the change in the operation current is small, the NPN transistor $Q_5$ and the column line setting voltage $V_y$ can be set very stably.

The source of the NMOS transistor $M_{n1}$ is connected to the base of the NPN transistor $Q_5$. When a control signal $C_y$ turns to its "H" level to turn on the NMOS transistor $M_{n1}$, therefore, the base of the NPN transistor $Q_5$ is short-circuited to the emitter thereof to turn off the NMOS transistor $M_{n1}$ rapidly. In addition, the emitter potential of the NPN transistor $Q_5$ becomes equal to the base potential of the NPN transistor $Q_5$. If the value of the resistor $R_4$ is suitably chosen, the current flowing through the diodes $D_6$ and $D_7$ is decreased to lower the base potential of the NPN transistor $Q_5$ when the PMOS transistor $M_{p1}$ turns off. Thus, it is possible to reduce the base voltage of the NPN transistor $Q_5$ as much as a voltage almost equal to a difference in the base potential of the NPN transistor $Q_5$ between when the base of the NPN tansistor $Q_5$ is short-circuited to the emitter thereof to make the voltage between them zero and when the base of the transistor $Q_5$ is lowered as mentioned above. When the column lines $Y_1$ to $Y_n$ are recharged, it is hardly necessary to charge the parasitic capacitance located at the node A. Therefore, it becomes possible to activate the precharge circuit 5 at a high speed and significantly reduce the precharge time.

If the source of the NMOS transistor $M_{n1}$ in FIG. 5 is connected to a coupling point A' between the diodes $D_6$ and $D_7$, it becomes possible to further decrease the change in the potential at the point A when the NMOS transistor $M_{n1}$ turns on.

Further, even in FIGS. 2 and 4, it is possible to prevent the potential at the node A from being lowered to the ground potential by connecting the source of the NMOS transistor $M_{n1}$ to the anode of the diode $D_4$ or to the base of the NPN transistor $Q_4$.

Figures 6, 7:
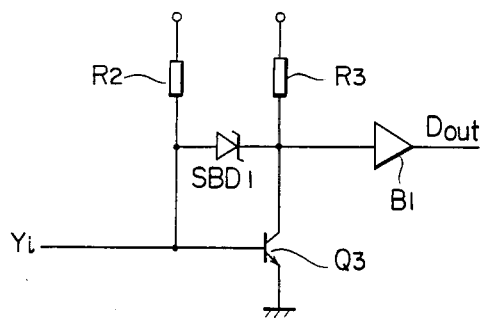
FIGS. 6, 7, 8A and 8B show embodiments of a sense amplifier and a time chart for the operation thereof.

FIG. 6 shows another embodiment of the sense amplifier 7 illustrated in FIG. 1. Reference letters in FIG. 6 that are like reference letters in FIG. 1 refer to like components. In FIG. 6, a Schottky diode SBD, is a clamp diode for preventing the saturation of the NPN transistor $Q_3$ in the same way as the diodes $D_1$ and $D_2$ of the sense amplifier 7 illustrated in FIG. 1. While in the sense amplifier 7 of FIG. 1 a part of the current flowing through the resistor $R_2$ is always diverted to the collector side of the NPN transistor $Q_3$ through the diode $D_2$, in this embodiment the current flowing through the resistor $R_2$ is usually supplied to the base of the NPN transistor $Q_3$. Accordingly, the efficiency of utilization is improved, resulting in saved power consumption.

FIG. 7 shows another embodiment of the sense amplifier 7 illustrated in FIG. 1. Reference letters in FIG. 7 that are like reference letters in FIG. 1 refer to like components. In FIG. 7, the column line $Y_i$ is connected to a common anode coupling node B between diodes $D_1$ and $D_2$. As a result, the threshold voltage $V_{st}$ of the sense amplifier 7 becomes approximately $2V_{BE}$ (1.2 to 1.6 V). Accordingly, the column line setting voltage $V_y$ of the column line voltage setting circuit 10 must also be approximately $2V_{BE}$ in conformity with the threshold voltage $V_{st}$. This can be easily attained by adding a diode in series with the diodes $D_3$ and $D_4$ of FIG 2, the diode $D_5$ of FIG. 4, or the diode $D_7$ of FIG. 5, for example. When there is a difference between the column line setting voltage $V_y$ and the potential at a node B in this embodiment, the diodes $D_1$ and $D_2$ can prevent the NPN transistor $Q_3$ of the sense amplifier from being saturated by a current rushing from the parasitic capacitance $C_{py}$ of the column line into the base of the transistor $Q_3$.

Figure 8A:
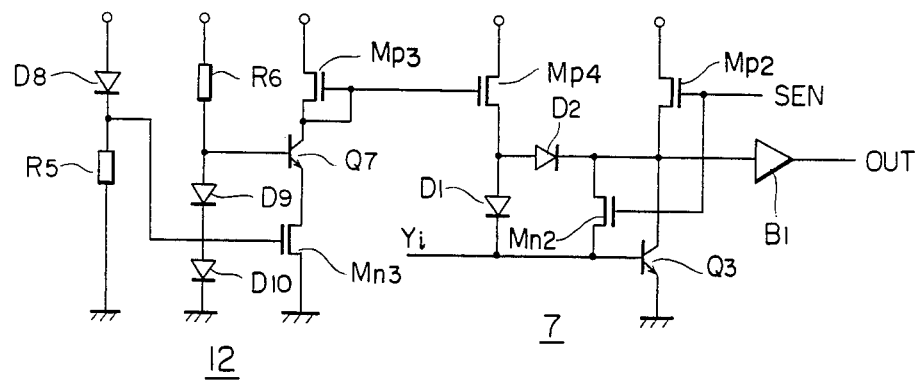

FIG. 8A shows still another embodiment of the sense amplifier 7 illustrated in FIG. 1. Reference letters in FIG. 8A that are like reference letters in FIG. 1 refer to like components. The sense amplifier of FIG. 8A includes an NPN transistor $Q_7$, NMOS transistors, $M_{n2}$ and $M_{n3}$, PMOS transistors $M_{p2}$, $M_{p3}$ and $M_{p4}$, resistors $R_5$ and $R_6$, and diodes $D_8$, $D_9$ and $D_{10}$.

Figure 8B:
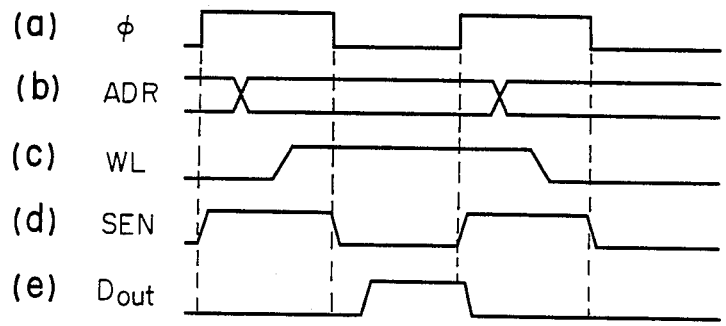

FIG. 8B is a time chart for the operation of the circuit illustrated in FIG. 8A. The gate of the NMOS transistor $M_{n2}$ and the gate of the PMOS transistor $M_{p2}$ are controlled by a sense amplifier control signal SEN. During the period of clock $\Phi$ while the sense amplifier 7 is not working, the control signal SEN turns to the "H" level as illustrated in waveform (d) of FIG. 8B. Thus, the NMOS transitor $M_{n2}$ turns on and the PMOS transistor $M_{p2}$ turns off. When the PMOS transistor $M_{p2}$ turns off, the load resistance of the NPN transistor $Q_3$ becomes substantially infinitely great, $\infty$. Thus the collector current is cut off, resulting in saved power dissipation. Since the NMOS transistor $M_{n2}$ turns on, the saturation of the NPN transistor $Q_3$ is prevented. The PMOS transistor $M_{p4}$ is provided for supplying the base current to the NPN transistor $Q_3$. The base current of the NPN transistor $Q_3$ must be so defined that the NPN transistor $Q_3$ may sufficiently turn on when the memory transistor M is absent on the column line $Y_i$, and the base current of the NPN transistor $Q_3$ must not be so large as to saturate the NPN transistor $Q_3$ even in saturation. In addition, the base current of the NPN transistor $Q_3$ must be small enough to raise the collector voltage of the NPN transistor $Q_3$ to bring it into the OFF state or nearly into the OFF state when the memory transistor M is present on the column line $Y_i$ and it is selected to divert a part of the base current of the NPN transistor $Q_3$ thereto. That is to say, the base current of the NPN transistor $Q_3$ and its load resistance must be determined in close relation to the ON resistance of the memory transistor M.

This object is attained by the circuit illustrated in FIG. 8A. At first, both the load circuit and base bias circuit of the PNP transistor $Q_3$ comprise the PMOS transistors $M_{p2}$ and $M_{p4}$ as constituent elements to make the circuits match each other. Thus, the circut of FIG. 8A is hardly affected by nonuniformity in the manufacturing process. In addition, the PMOS transistor $M_{p4}$ of the base bias circuit is made to be a constant current source, the current value of which is defined by the channel conductance of the memory transistor M constituting a memory cell. A gate bias circuit 12 is provided for this purpose. In the circuit 12, the NMOS transistor $M_{n3}$ is so formed as to have the same size as that of the memory transistor M constituting a memory cell. The NMOS transistor $M_{n3}$ is driven with the gate voltage being nearly set to the row (X) line voltage of the memory matrix and with the drain voltage being nearly set to the column (Y) line voltage. The base bias current is defined as the product of a proportionality constant K and the drain current of the NMOS transistor $M_{n3}$ driven as described above. The proportionality constant K is defined by a current mirror circuit comprising the PMOS transistors $M_{p3}$ and $M_{p4}$. In the embodiment of FIG. 1, the gate of the memory tansistor M constituting a memory cell is driven by the emitter follower circuit and the row line voltage $V_x$ can be represented as $V_x = V_{cc} - V_{BE}$. And the drain voltage $V_y$ is the column line setting voltage $V_y$, and it follows that $V_y = V_{BE}$. In the circuit 12, the circuit comprising the resistor $R_6$, diodes $D_9$ and $D_{10l}$, and the NPN transistor $Q_7$ produes the row line voltage $V_x$, and the circuit comprising the diode $D_8$ and the resistor $R_5$ produces the column line voltage $V_y$. The PMOS transistors $M_{p3}$ and $M_{p4}$ are formed to have a ratio of approximately 2:1 in channel width, and the current transfer ratio k is chosen to be approximately 0.5. By this embodiment, the optimum design allowance with respect to the process nonuniformity can be chosen. Thus, it is possible to realize a semiconductor memory with a high yield rate and without sacrificing the speed and power dissipation.

Figure 9:
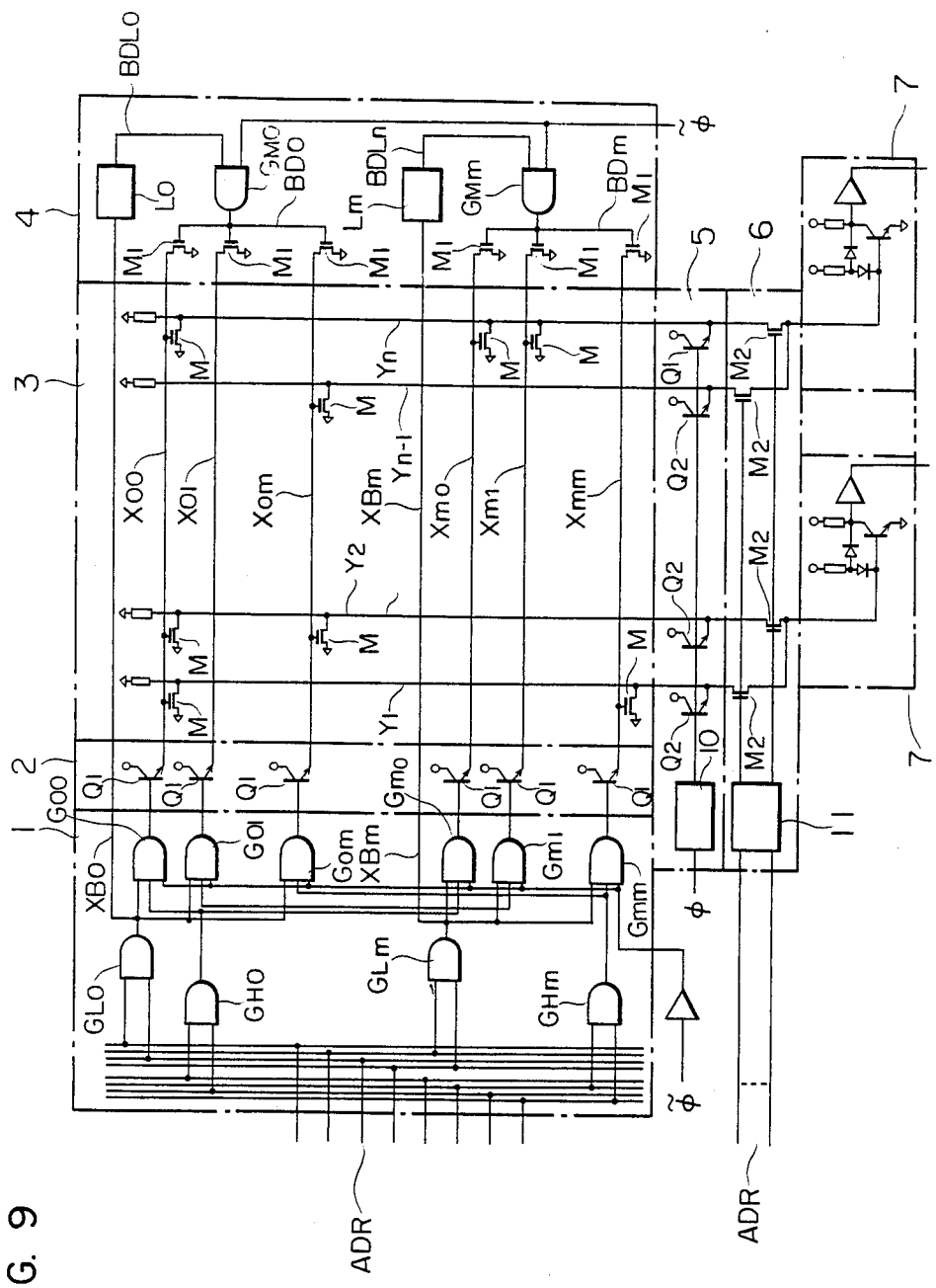
FIGS. 9, 10, 11 and 12 show memory configuration diagrams and time charts of other embodiments.
Figure 10:
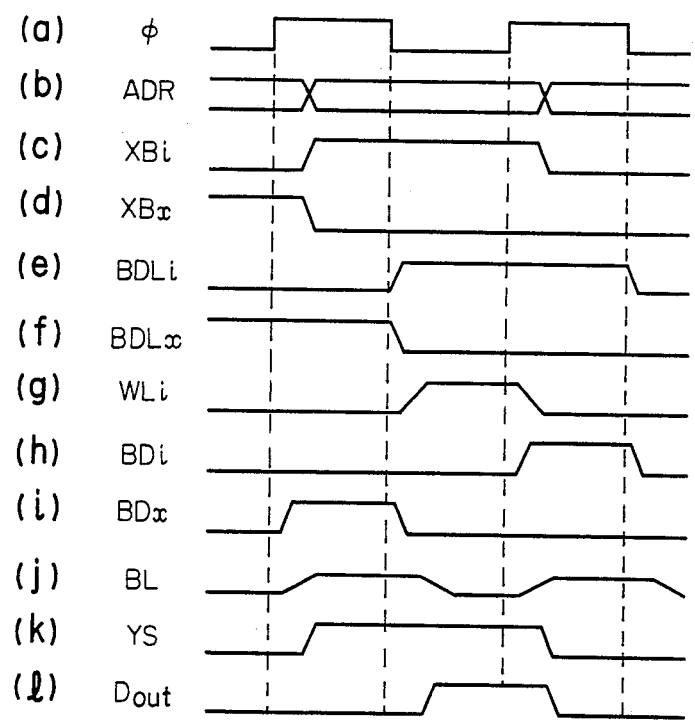

FIG. 9 shows another embodiment of a semiconductor memory according to the present invention. Reference letters in FIG. 9 that are like reference letters in FIG. 1 refer to like components. The embodiment of FIG. 9 includes AND gates $G_{Ho}$ to $G_{Hm}$ for decoding the upper address, AND gates $G_{Lo}$ to $G_{Lm}$ for decoding the lower address, AND gates $G_{oo}$ to $G_{mm}$ for selecting one row line on the basis of decoding result of the upper and lower address, row lines $X_{oo}$ to $X_{mm}$, latch circuits $L_o$ to $L_m$, and AND gate $G_{Mo}$ to $G_{Mm}$. In the embodiment of FIG. 1, all of the MOS transistors $M_1$ in the discharge circuit 4 are driven each readout cycle. When the number of row lines is large, the power dissipation cannot be neglected. In addition, the load of the gate $G_2$ becomes heavy and hence the operation speed is also lowered. This drawback is mitigated in the embodiment of FIG. 9, the time chart of which is illustrated in FIG. 10.

The basic operation of the embodiment of FIG. 9 will now be described. From the decoding AND gates $G_{Lo}$ to $G_{Lm}$ for the lower address, a block signal $XB_i$ (waveform (c) of FIG. 10) for designating a block of row lines is produced. The block signal $XB_i$ is latched in a latch circuit $L_i$ to be converted to a block discharge signal $BLD_i$ (waveform (e) of FIG. 10). By a discharge MOS drive signal $BD_i$ (waveform (h) of FIG. 10) produced from the block discharge signal $BDL_i$ (waveform (e) of FIG. 10), a dicharge MOS transistors $M_1$ belonging to the block having the driven row line are driven at the former half of the next readout cycle. Therefore, the number of the discharge MOS transistors $M_1$ which are driven becomes small, resulting in lower power dissipation and higher speed.

Figure 11:
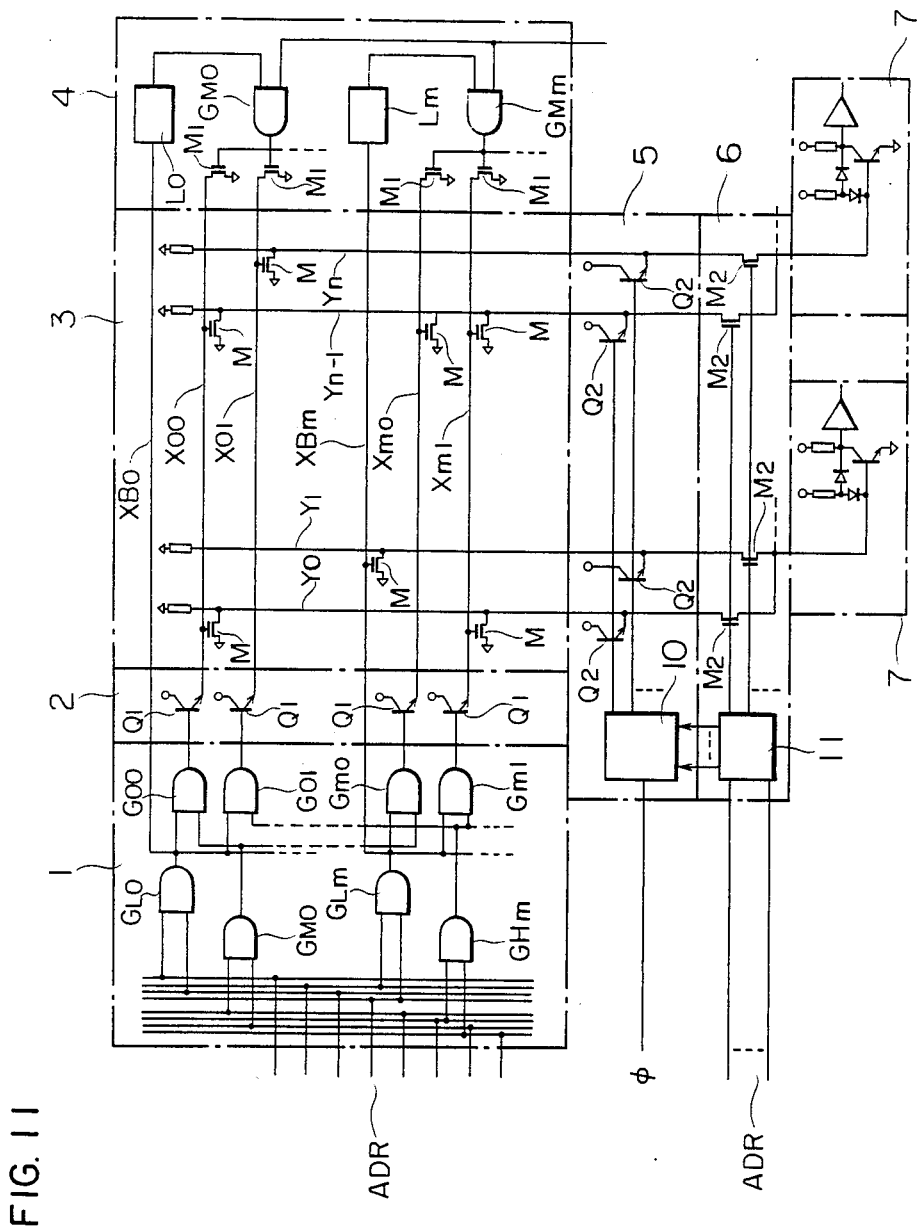
Figure 12:
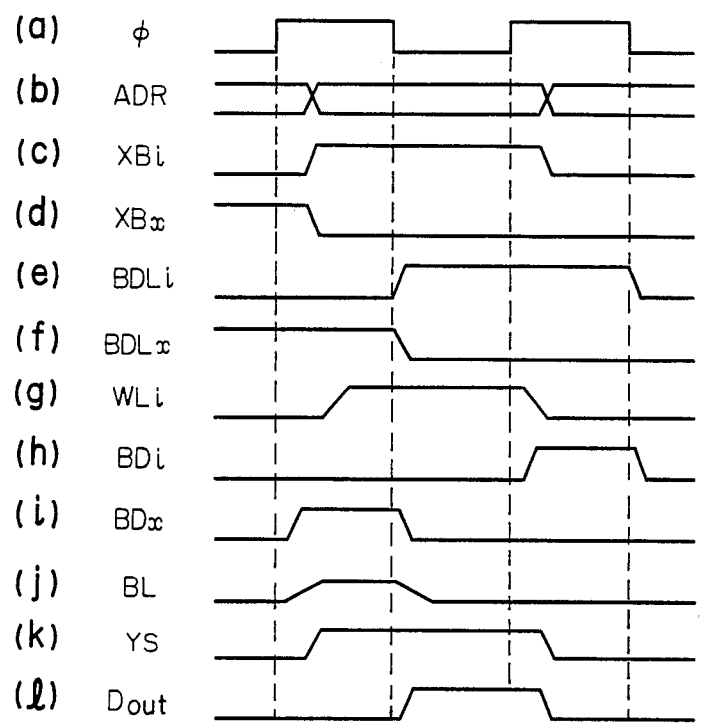

FIG. 11 shows another embodiment of the present invention. Reference letters in FIG. 11 that are like reference letters in FIGS. 1 and 9 refer to like components. The embodiment of FIG. 11 differs from that of FIG. 9 in that the clock signal is not applied to inputs of the AND gates $G_{oo}$ to $G_{mm}$ located at the final stage of the decoder and that the output of the Y decoder 11 controls the column line voltage setting circut 10 in the precharge circuit 5 to precharge only a selected column line. FIG. 12 shows the operation time chart of the circuit illustrated in FIG. 11. Since the output of the X decoder is sent out without being subjected to AND operation with the clock $\Phi$, the block signal $XB_i$ (waveform (c) of FIG. 12) and the X-line drive signal $WL_i$ (waveform (g) of FIG. 12) appear during the duration of the clock $\Phi$. Accordingly, the row line is driven earlier and hence the output $D_{out}$ of the sense amplifier 7 is produced earlier, resulting in higher speed of operation. Further, precharging of the column lines $Y_o$ $Y_n$ is carried out only for a column line selected by the Y decoder. Assuming that the Y decoder conducts decoding at a ratio of ⅛, for example, the power required for charging and discharging the parasitic capacitance of the column line is further reduced to ⅛. Approximately 70 mW in the embodiment of FIG. 1 is reduced to approximately 9 mW in that of FIG. 12.

Figure 13:
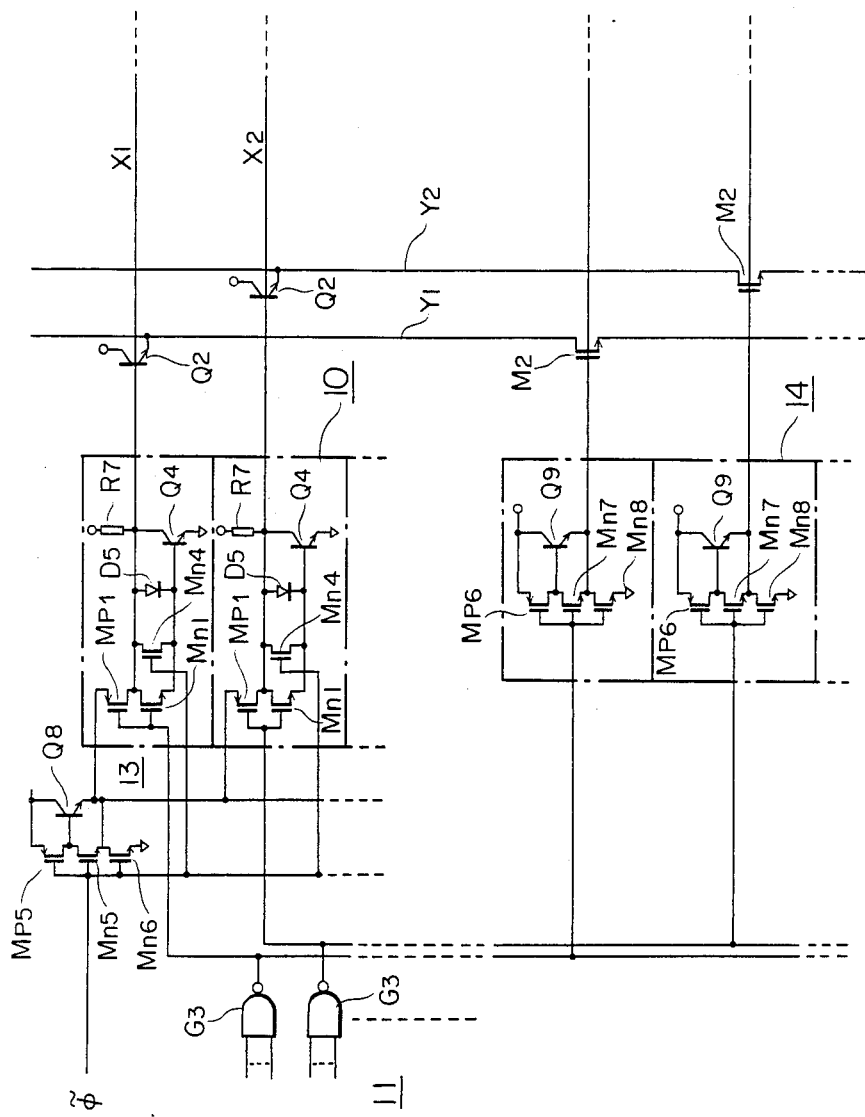
FIG. 13 shows an embodiment of a part of a memory illustrated in FIG. 11.

FIG. 13 shows embodiments of the Y decoder 11 and the column line voltage setting circuit 10 illustrated in the embodiment of FIG. 11. Reference letters in FIG. 13 that are like reference letters in FIGS. 1 and 4 refer to like components. The column line voltage setting circuit 10 in FIG. 13 has nearly the same configuration as that of FIG. 4. The difference exists in that the source of the NMOS transistor $M_{n1}$ is connected to the base of the NPN transistor $Q_4$, that an NMOS transistor $M_{n4}$ having a gate controlled by the clock $\widetilde{\Phi}$ is connected in parallel with the NMOS transistor $M_{n1}$, and that the gate of the NMOS transistor $M_{n1}$ and the gate of the PMOS transistor $M_{p1}$ are controlled by the output of the Y decoder 11 and the source of the PMOS transistor $M_{p1}$ is driven by a clock driver 13. A Y driver circuit 14 includes an NPN transistor $Q_9$, a PMOS transistor $M_{p6}$, NMOS transistors $M_{n7}$ and $M_{n8}$.

Figure 14:
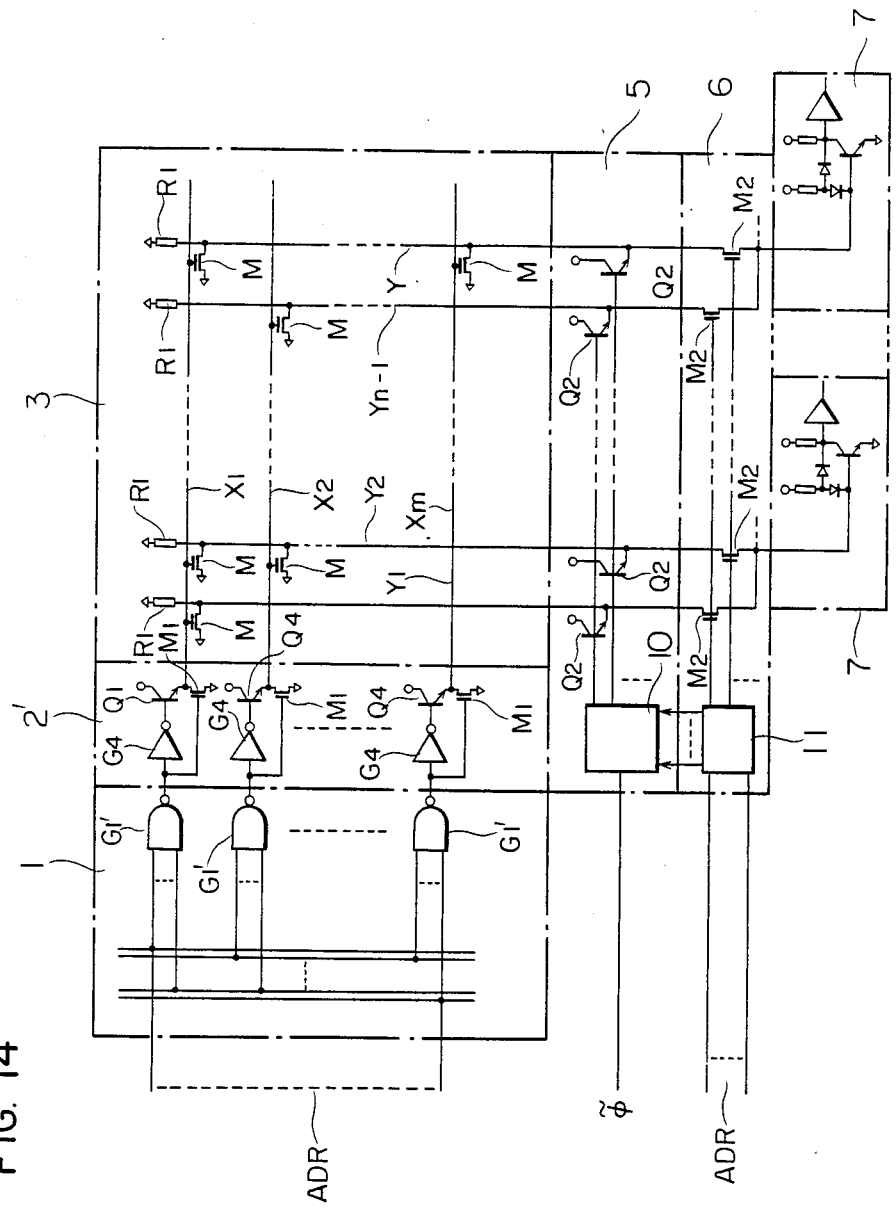
FIGS. 14 and 15 show memory configuration diagrams and time charts of another embodiment, respectively.
Figure 15:
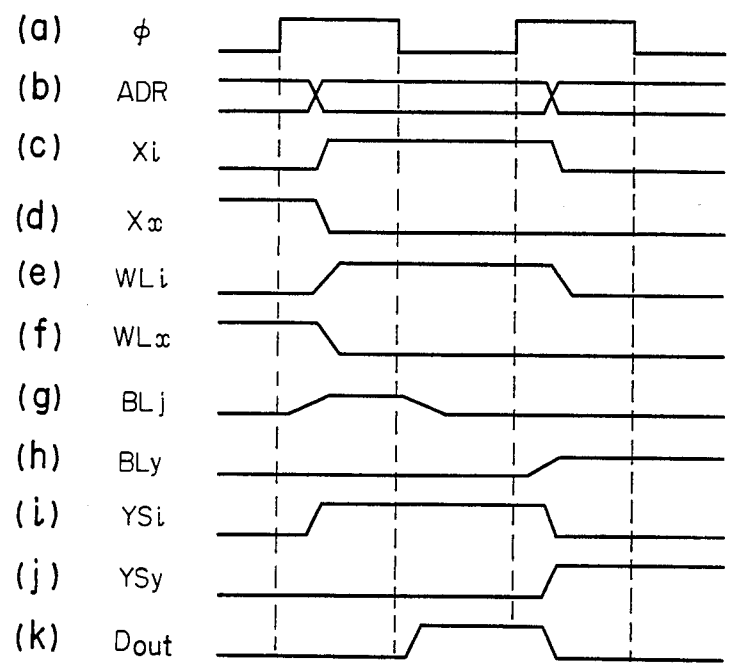

FIG. 14 shows still another embodiment of the present invention. Reference lettrers in FIG. 14 that are like reference letters in FIG. 1 refer to like components. The embodiment of FIG. 14 differs from that of FIG. 1 in that the clock signal is not applied to the input of a NAND gate $G_1'$, that the base of the NPN transistor $Q_1$ is driven by the output of the X decoder through an inverter $G_4$ and the MOS transistor $M_1$ for X-line discharging is directly driven by the output of the X decoder, and that only a column line selected by the Y decoder is precharged in the same way as the embodiment of FIG. 11. The operation chart of this embodiment is illustrated in waveforms (e) and (f) of FIG. 15. As illustrated in FIG. 15 the row line voltage $W_{Lx}$ and $W_{Li}$ are so produced as to correspond in both rising and falling edges to a decoder output $X_x$ of the previous cycle (waveform (d) of FIG. 15) and a decoder output $X_i$ of the present cycle (waveform (c) of FIG. 15), respectively, and only the output voltage of the precharge circuit 5 as illustrated in waveform (g) and (h) of FIG. 15 is controlled by the clock $\Phi$. Since individual row lines are activated independently by the decoder output and precharging is also controlled by the Y decoder output, the operation with high speed and low power consumption can be realized.

Figure 16:
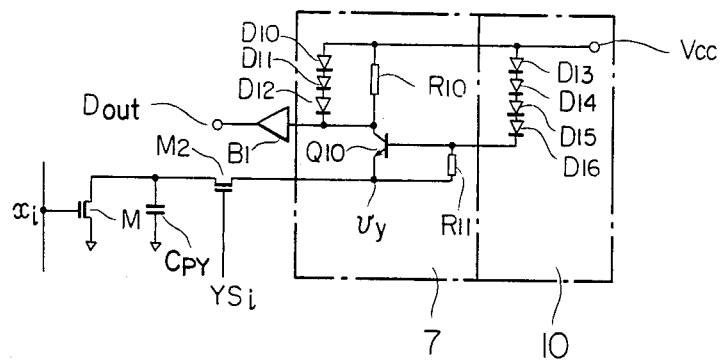
FIGS. 16, 17 and 18 show other embodiments of a sense amplifier and a column line voltage setting circuit according to the present invention.

FIG. 16 shows other embodiments of the sense amplifier 7 and the column line voltage setting circuit 10 according to the present invention. Reference letters in FIG. 16 that are like reference letters in FIG. 1 refer to like components. In the circuit of FIG. 16, diodes $D_{10}$ to $D_{16}$, an NPN transistor $Q_{10}$, and resistors $R_{10}$ and $R_{11}$ are included. An NPN transistor $Q_{10}$ included in the sense amplifier 7 is common base type, and diodes $D_{13}$ to $D_{16}$ constitute a bias circuit for defining the base potential. The bias voltage is represented as $V_{cc}-4V_F \simeq V_{cc}-4V_{BE}$. The column line setting voltage $V_y$ is further lower by the base-emitter voltage $V_{BE}$ of the NPN terransistor $Q_{10}$. Assuming that $V_{cc}$ is 5V in an equation $V_y=V_{cc}-5V_{BE}$, it follows that $V_y \simeq 1$ to 2V. Until the column line parasitic capacitance $C_{py}$ in the present circuit is charged up to thid column line setting voltage $V_y$, the charging current is mainly supplied from the emitter of the NPN transistor $Q_{10}$. When charging has been completed, the emitter current becomes zero to turn Dout to the "H" level. When $X_i$ is then driven to turn the memory transistor M on, a current from the parasitic cpacitance $C_{py}$ and the emitter of the NPN transistor $Q_{10}$ flows into the MOS transistor M. As a result, a voltage drop across the resistor $R_{10}$ is incurred to turn Dout to the "L" level. That is to say, the column line setting voltage $V_y$ in the present embodiment as well is equal to the threshold voltage $V_{st}$ of the sense amplifier 7. Accordingly, the potential of the column line is detected with the same sensitivity which was described with reference to the embodiment of FIG. 1. Thus, the column line setting voltage $V_y$ becomes nearly equal to the threshold voltage $V_{st}$ of the sense amplifier 7. Further, if charging the column line parasitic capacitance $C_{py}$ has been completed, there is no DC current path until the memory transistor M turns on, DC current being completely zero. Therefore, it is possible to realize an extremely excellent semiconductor memory which dissipates less power as compared with any of the above described sense amplifiers. The diodes $D_{10}$ to $D_{12}$ are clamp diodes for preventing the NPN transistor $Q_{10}$ from being saturated when the parasitic capacitance $C_{py}$ is charged.

Figure 17:
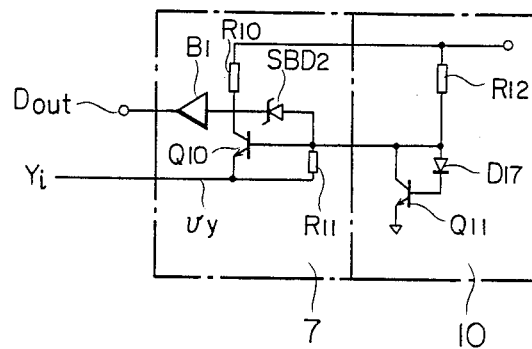

FIG. 17 shows another embodiment of the present invention. Reference letters in FIG. 17 that are like reference letters in FIGS. 1 and 16 refer to like components. In FIG. 17, the base of the NPN transistor $Q_{10}$ is biased to $2V_{BE}$ in nearly the same way as the embodiment of FIG. 4. Accodingly, the column line setting voltage $V_y$ is expressed as $V_y = V_{BE}$. This is nearly the same potential as the potential of FIGS. 2, 4 and 5.

Figure 18:
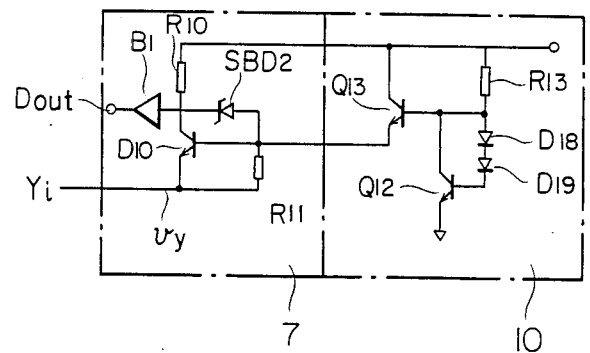

FIG. 18 shows the configuration of the sense amplifier 7 and the column line voltage setting circuit 10 according to another embodiment of the present invention. The sense amplifier 7 has the same confi9uration as the embodiment of FIG. 17. And the column line voltage setting circuit 10 has similar configuration to the embodiment of FIG. 5. In the embodiment of FIG. 18, the base current of the NPN transistor $Q_{10}$ is supplied from the NPN transistor $Q_{13}$. Only the base current of the NPN transistor $Q_{13}$ and the collector current and base current of the NPN transistor $Q_{12}$ are supplied from a resistor $R_{13}$. Thus, it becomes possible to realize small output impedance in a circuit of relatively large impedance. Further, the current of the resistor $R_{13}$, which is the source of the current flowing through diodes $D_{18}$ and $D_{19}$ required for setting the bias voltage, is not largely affected by the load of the circuit 10. Thus, stable output voltage is obtained.

In any of embodiments of FIGS. 16, 17 and 18, a plurality of sense amplifiers 7 can be connected to one column line voltage setting circuit 10.

Figure 19:
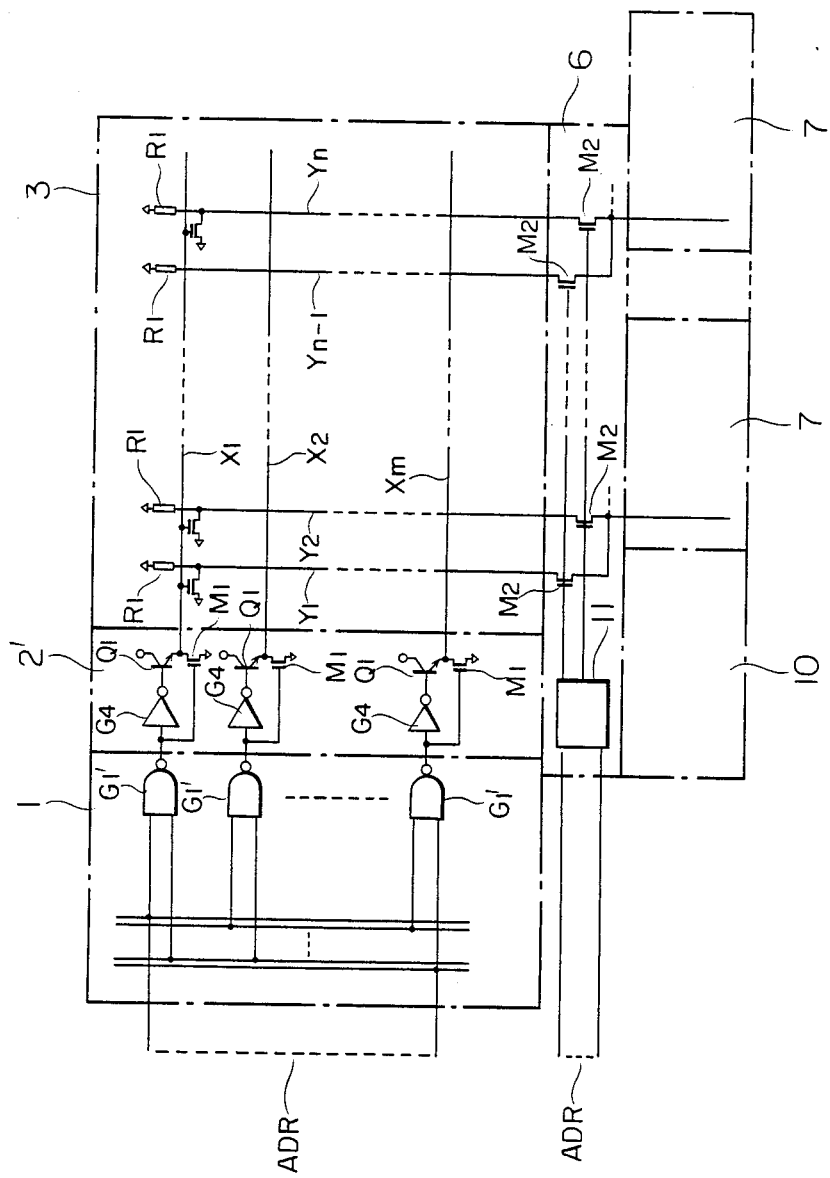
FIG. 19 shows an embodiment of a memory using the sense amplifiers and column line voltage setting circuits illustrated in FIGS. 16, 17 and 18.

FIG. 19 shows an embodiment of a semiconductor memory whereto the embodiments of FIGS. 16, 17 and 18 have been applied. Reference letters in FIG. 19 that are like reference letters in FIG. 14 refer to like components. In this embodiment, any part of the circuit is not controlled by the clock $\Phi$. Thus, a completely static ROM can be realized, resulting in further higher speed and lower power dissipation.

This sense amplifier 7 forms a part of the column line voltage setting circuit 10. The charging current for the parasitic capacitance of the column line is restricted by the load resistor $R_{10}$. In addition, this current depends upon the channel conductance of the MOS transistor M of the memory cell. Accordingly, this current cannot be made large freely. When the charging time of the above described parasitic capacitance becomes long, therefore, the column line voltage setting circuit 10 as illustrated in FIGS. 2, 4 and 5 can be provided to enhance the precharge capability. However, this results in a dynamic circuit.

Figure 20:
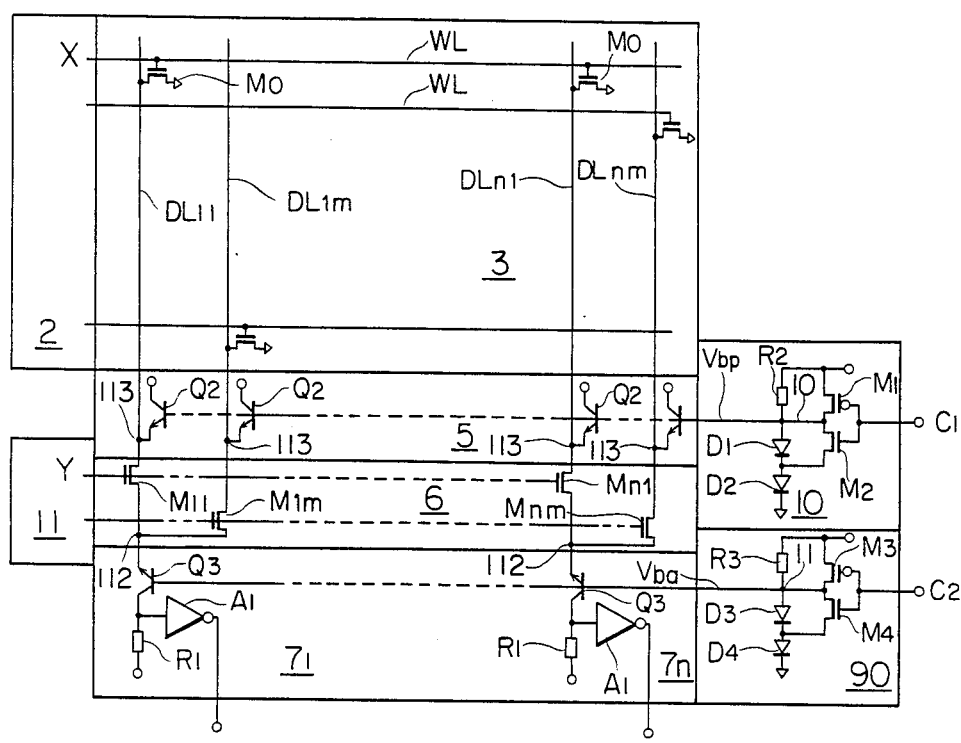
FIG. 20 shows a circuit diagram for illustrating another embodiment of the present invention.
Figure 21:
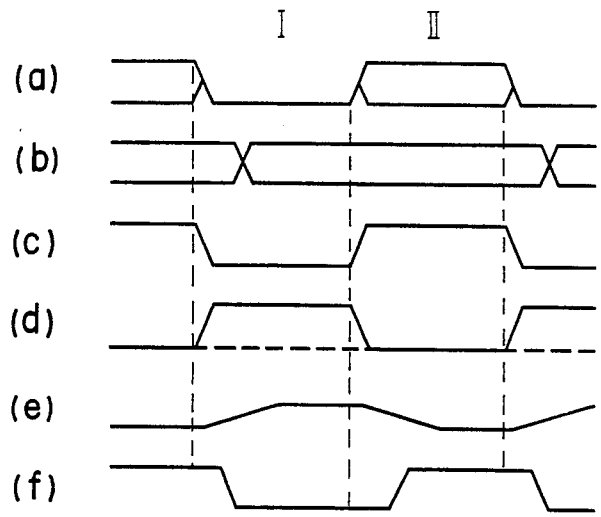
FIG. 21 shows waveforms appearing at various points of FIG. 20.

FIG. 20 shows the circuit configuration of a semiconductor memory which is another embodiment of the present invention. FIG. 21 shows the operation time chart of the circuit illustrated in FIG. 21. The embodiment of FIG. 20 shows the case of a read only memory (hereafter abbreviated as ROM). Reference numeral 3 denotes a memory cell matrix in which MOS transistors constituting memory cells can be arranged in a matrix form. Row lines and column lines are represented by $W_L$ and $DL_{ij}$ (i=1 to n, j=1 to m), respectively. Reference numberal 2 denotes an X decoder. A precharge circuit 5 is provided for charging the parasitic capacitance of the column line $DL_{ij}$. $Q_2$ denotes a bipolar transistor, the emitter (reference electrode) of which is connected to the column line Dij at a node 113 and the collector of which is connected to a first power source. Numeral 11 denotes a Y decoder. Numeral 6 denotes a Y selector circuit. MOS transistors $M_{ij}$ (i=1 to n, j=1 to m) are provided to select one out of each group of column lines $DL_{1j}$, $DL_{2j}$...$DL_{nj}$ (j=1 to m) belonging to the same bit and connect it to a common node 112 of each group. A sense amplifier $7_i$ (i=1 to n) includes a second bipolar transistor $Q_3$, the emitter (reference electrode) of which is connected to a common node 112 of each bit of the above described column line $DL_{ij}$ and the collector of which is connected to a resistor $R_1$. A buffer amplifier $A_1$ converts the collector voltage of the second bipolar transistor $Q_3$ into the desired logical output voltage which has been shaped. The resistor $R_1$, bipolar transistor $Q_3$ and buffer amplifier $A_1$ constitute each of sense amplifiers $7_1$ to $7_n$ for amplifying the voltage appearing at the common node 112 of the column line $D_{ij}$. A column line voltage setting circuit 10 supplies the base (control electrode) voltage of the first bipolar transistor $Q_2$ which is a constituent of the precharge circuit 5. The column line voltage setting circuit 10 is composed of a resistor $R_2$, diodes $D_1$ and $D_2$, a P-channel MOS transisor $M_1$, and an N-channel MOS transistor $M_2$. A sense amplifier bias circuit 90 supplies the base (control electrode) voltage of a second bipolar transistor $Q_3$ which is a constituent of the sense amplifier. The sense amplifier bias circuit 90 is composed of a resistor $R_3$, diodes $D_3$ and $D_4$, a P-channel MOS transistor $M_3$ and a N-channel MOS transistor $M_4$.

The operation of the circuit of FIG. 20 will now be described by referring to a time chart of FIG. 21. Waveform (b) of FIG. 21 shows the waveform of the output signal of the Y decoder 11. Among the MOS transistors $M_{ij}$ (i=1 to n, j=1 to m) constituting the Y selector circuit 6, $M_{ijo}$ (i=1 to n) is driven. Among colum lines $DL_{ij}$, lnes $DL_{ijo}$ (i=1 to n) are selectively connected to the sense amplifiers $7_i$ (i=1 to n), respectively.

Waveform (c) of FIG. 21 shows the waveform of a control signal $C_1$ of the column line voltage setting circuit 10. The control signal $C_1$ turns to the "L" level in the precharge section I. As a result, the PMOS transistor $M_1$ turns on and the NMOS transistor $M_2$ turns off. Accordingly, the output voltage $V_{bp}$ of the column line voltage setting circuit 10 is applied to the base of the bipolar transistor $Q_2$ in the precharge circuit 5. Since the drain of the PMOS transistor $M_1$ is clamped to the second power supply by diodes $D_1$ and $D_2$, the output voltage $V_{bp}$ can be represented as $V_{bp} = 2V_F$, where $V_F$ is the forward voltage drop across the diode. The forward voltage drop $V_F$ across the diode is nearly equal to the base-emiter voltage $V_{BE}$ of the bipolar transistor. Accordingly, the output voltage of the column line voltage setting circuit 10 can be represented as $V_{bp} = 2V_F \simeq 2V_{BE}$. Hence, the precharge voltage $V_p$ of the column line (voltage at the node 113) can be represented as $V_p \simeq V_{BE}$.

Waveform (e) of FIG. 2l(e)- shows the waveform of the column line voltage. As described above, the parasitic capacitance of the column line is charged by the emitter current of the bipolar transistor $Q_2$ to be set to $V_F = V_{BE}$. In a section II which is a discharge section, the control signal $C_1$ turns to the "H" level. Accordingly, the PMOS transistor $M_1$ of the column line voltage setting circuit 10 turns off and the NMOS transistor $M_2$ turns on. As a result, the diode $D_1$ is short-circuited by the NMOS transistor $M_2$. The output voltage of the circuit 10 thus becomes $V_{bp}=V_F$ to turn off the first bipolar transistor $Q_2$ of the precharge circuit 5. The resistor $R_2$ functions to supply a bias current to the diode $D_2$ through the NMOS transistor $M_2$ and clamp the output voltage $V_{bp}$ of the column line voltage setting circuit 10 to $V_F$ during the discharge section II.

As shown in waveform (d) of FIG. 21, a control signal $C_2$ of the sense amplifier bias circuit 90 turns to the "L" level during the discharge section II. Since in this embodiment the sense amplifier bias circuit 90 is configured similarly to the above described column line voltage setting circuit 10, the operation of the circuit 90 is similar to that of the column line voltage setting circuit 10 during the precharge section I. Accordingly, the output voltage $V_{ba}$ of the sense amplifier bias circuit 90 is so biased as to satisfy the relation $V_{ba}=2V_F\approx2V_{BE}$. The voltage $V_F$ of the emitter of the bipolar transistor $Q_3$ which forms the input terminal of the sense amplifier $7_i$ (i=1 to n) is so set as to satisfy the relation $V_F=V_{BE}$.

Under such a state, the output signal X of the X decoder 2 as illustrated in waveform (A) of FIG. 21 is sent to one of the row lines WL. If a MOS transistor $M_o$ is present at the intersection of the row line $W_L$ and the column line $DL_{nm}$, therefore, the electronic charge stored across the parasitic capacitance of the column line $DL_{nm}$ is discharged through the MOS transistor $M_o$, the potential $V_D$ of the column line being lowered. The precharge voltage $V_p$ of the column line $DL_{nm}$ set by the column line voltage setting circuit 10 during the precharge section I is nearly equal to the sense amplifier input voltage $V_F$ during the discharge section II. Accordingly, the descent of the column line voltage $V_D$ directly becomes the change in the sense amplifier input voltage. As illustrated in waveform (f) of FIG. 21, therefore, the output voltage of the sense amplifier is settled with an extremely short delay.

The broken line indicated in waveform (d) of FIG. 21 corresponds to a state in which the control signal $C_2$ of the sense amplifier bias circuit 90 is fixed to the "L" level.

As described above, the base-emitter voltage $V_{BE}$ of the first bipolar transistor $Q_2$ in the precharge circuit 5 is equal to the base-emitter voltage $V_{BE}$ of the second bipolar transisstor $Q_3$ in the sense circuit 70. If the control signal $C_2$ is the "L" level during the precharge section I, therefore, the collector current of the second bipolar transistor $Q_3$ in the sense circuit 70 is equal to the collector current of the first bipolar transistor $Q_2$ in the precharge circuit 5. In general, this current value is significantly larger than the readout current flowing through the above described MOS transistor $M_o$ of the memory cell. Accordingly, the second bipolar transistor $Q_3$ of the sense circuit 70 may be saturated due to the voltage drop across the resistor $R_1$ and may hinder the operation. To prevent this, the control signal $C_2$ is turned to the "H" level during the precharge section I. Since the output voltage $V_{ba}$ of the sense amplifier bias circuit 90 thus satisfies the relation $V_{ba}<V_{bp}$, the second bipolar transistor $Q_3$ is cut off. In this embodiment, however, a MOS transistor $M_{ij}$ (i=1 to n, j=1 to m) of the Y selector circuit 6 is connected between the column line $DL_{ij}$, whereto the emitter of the first bipolar transistor $Q_2$ in the precharge circuit 5 is connected, and the common node 112, whereto the emitter of the second bipolar transistor $Q_3$ in the sense circuit 5 is connected. Therefore, it is possible to restrict the current flowing from the second bipolar transistir $Q_3$ in the sense circuit 70 to the column line $D_{ijo}$ side. Accordingly, saturation of the second bipolar transistor $Q_3$ can be prevented by suitably setting the channel conductance of the MOS transistor $M_{ij}$ and the resistance value of the resistor $R_2$. In this case, it is possible to fix the control signal to the "L" level as represented by broken lines in waveform (d) of FIG. 21. In this case, the MOS transistors $M_3$ and $M_4$ of the sense amplifier bias circuit 90 do not have the function of the control gate. By suitably choosing the resistance value of the resistor $R_3$, therefore, the MOS transistors $M_3$ and $M_4$ can be eliminated.

Figure 22:
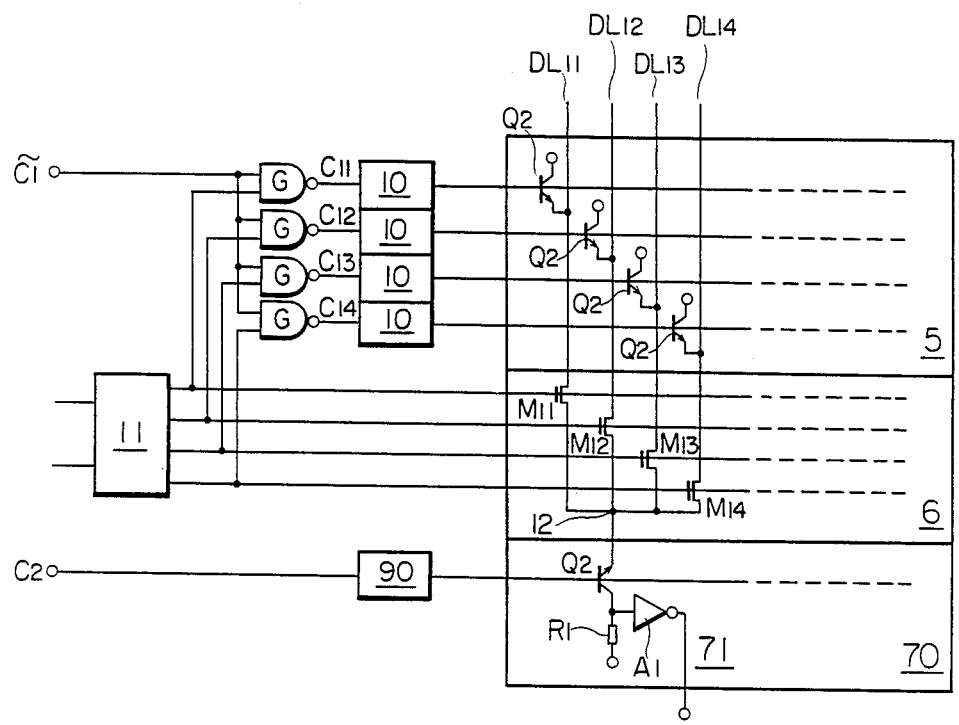
FIGS. 22, 23 and 24 show circuit diagrams for illustrating other embodiments.

FIG. 22 shows still another embodiment of the present invention. In this semiconductor memory, the memory matrix 1 and the decoder 2 are eliminated, and the relation m=4 holds true. Reference letters in FIG. 22 that are like reference letters in FIG. 20 refer to like components.

The embodiment of FIG. 20 is that four column line voltage setting circuits 10 are provided corresponding to the number of output signals of the Y decoder 11. Control signals $C_{11}$ to $C_{14}$ of the column line voltage setting circuit are controlled by the output signals of the Y decoder 11. The output signal of each column line voltage setting circuit 10 applies the bias voltage to the base of the first bipolar transistor $Q_2$ for precharging the data line $DL_{ijo}$ selected by the Y decoder 11.

According to this embodiment, only one out of m (m=4 in FIG. 22) column lines belonging to one bit is selectively precharged. Accordingly, the power dissipation required for charging and discharging the parasitic capacitance in the memory matrix can be reduced to 1/m. In case of a large capacity memory, reduction in the output current of the column line voltage setting circuit 10 by 1/m means reduction in the charging electronic chage to the memory matrix per circuit by 1/m. Thus, the time required for precharge can be reduced and the maximum emitter current of the first bipolar transistor $Q_2$ in the precharge circuit 5 can be restricted to a practically reasonable value, resulting in improved reliability.

Figure 23:
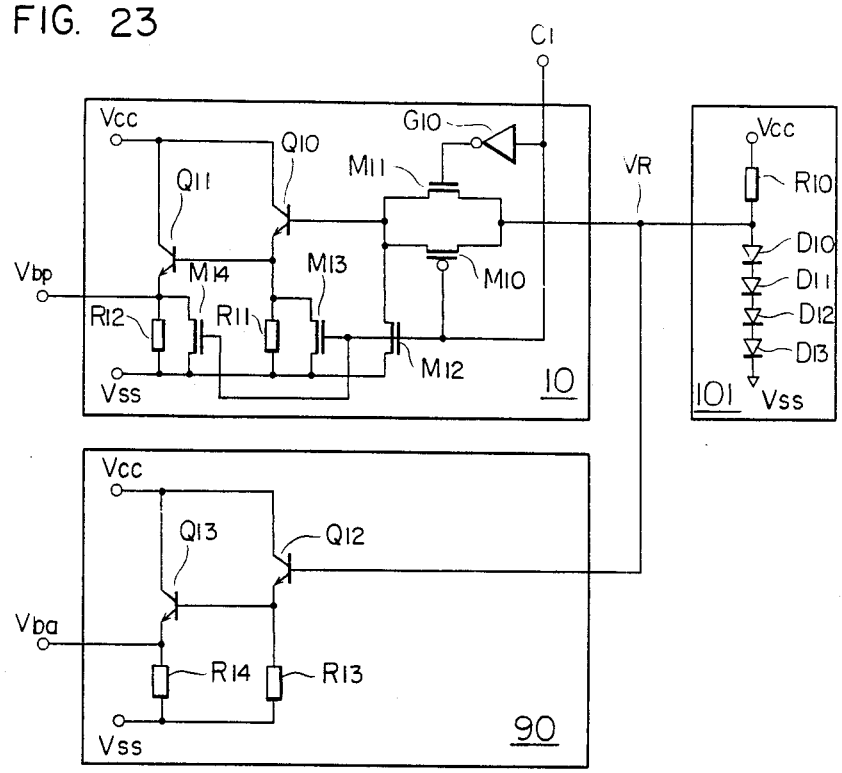

FIG. 23 shows other embodiments of the column line voltage setting circuit 10 and the sense amplifier bias circuit 90 illustrated in FIGS. 20 and 22. Reference letters in FIG. 23 that are like reference letters in FIGS. 20 and 22 refer to like components.

In FIG. 23, a reference voltage circuit 101 supplies common reference voltage $V_R$ to both the column line voltage setting circuit 10 and the sense amplifier bias circuit 90. The reference voltage circuit 101 includes a resistor $R_{10}$ and diodes $D_{10}$ to $D_{13}$. In the column line voltage setting circuit 10 and the sense amplifier bias circuit 90, resistors $R_{11}$ to $R_{14}$, a PMOS transistor $M_{10}$, NMOS transistors $M_{11}$ to $M_{14}$, bipolar transistors $Q_{10}$ to $Q_{13}$ and an inverter $G_{10}$ are included.

The operation in the configuration of FIG. 23 will now be described. A bias current for diodes $D_{10}$ to $D_{13}$ connected in series is supplied from the resistor $R_{10}$ which is connected to the first power supply Vcc and which forms a bias circuit. The forward voltage drop $4V_F=V_R$ thus produced is used as the common reference voltage for the column line volttage setting circuit 10 and the sense amplifier bias circuit 90. In the sense amplifier bias circuit 90, the base of the bipolar transistor $Q_{12}$ is connected to the output of the reference voltage circuit 101, and the emitter of the bipolar transistor $Q_{12}$ is connected to the base of the bipolar transistor $Q_{13}$. The emitter of the bipolar transistor $Q_{13}$ is used as the output terminal of the sense amplifier bias circuit 90. Resistors $R_{13}$ and $R_{14}$ are bias resistors for keeping the base-emitter voltage $V_{BE}$ of each of bipolar transistors $Q_{12}$ and $Q_{13}$ higher than a fixed value when loads of the resistors $R_{13}$ and $R_{14}$ are light or absent.

By cascade connection of the bipolar transistors $Q_{12}$ and $Q_{13}$ as described above, it becomes possible to obtain a sufficiently large current amplification factor and restrict a change in output voltage $V_{ba}$ with respect to a change in load (a change in emitter current of the bipolar transistor $Q_{13}$) to a sufficiently small value. Assuming that the forward voltage drop $V_F$ of the diodes $D_{10}$ to $D_{13}$ can be represented as $V_F \simeq V_{BE}$ in the same way as FIG. 20, the output voltage $V_{ba}$ can be represented as $V_{ba} = 4V_{BE} - 2V_{BE} = 2V_{BE}$, which is equal to the output voltage of FIG. 20.

The column line voltage setting circuit 10 is obtained by adding a switching circuit for interrupting the output to the above-described sense amplifier bias circuit 90. That is to say, a PMOS transistor $M_{10}$ and an NMOS transistor $M_{11}$ connected in parallel are inserted into the base circuit of the bipolar transistor $Q_{10}$ to switch the base current of the bipolar transistor $Q_{10}$. NMOS tansistors $M_{12}$ and $M_{13}$ are provided for extracting the base storage charge of the bipolar transistors $Q_{10}$ and $Q_{11}$ at high speed when the base current is cut off. Thereby, the emitter current of the bipolar transistor $Q_{11}$, which is the output current of the column line voltage setting circuit 10, is cut off at high speed.

The remaining basic configuration of the circuit 10 is similar to the sense amplifier bias circuit 90. In the column line voltage setting circuit 10, the switching MOS transistors $M_{10}$ and $M_{11}$ are inserted in series between the base of the bipolar transistor $Q_{10}$ and the reference voltage circuit 101. Therefore, a high current amplification factor as described above is especially effective in reducing the voltage drop across the MOS transistors $M_{10}$ and $M_{11}$ and in stabilizing the output voltage.

Since in this embodiment the reference voltage circuit 101 for determining the output voltage of the column line voltage setting circuit 10 and that of the sense amplifier bias circuit 90 is used in common for both circuits, it is possible to maintain excellent harmony between the output voltage $V_{bp}$ and $V_{ba}$ of these two circuits. Further, sufficiently large current amplification factors are assured in these two circuits. Even when a plurality of column line voltage setting circuits 10 are provided as in the embodiment of Fig. 22, therefore, it is possible to obtain stable, well-matched output voltage values by using the common reference voltage. It is a matter of course that a plurality of sense amplifier bias circuits 90 can also be connected to one reference voltage circuit 101, if necessary.

In the above described respective embodiments of the present invention, the parasitic capacitance of the column line is precharged via the first bipolar transistor having the emitter coupled to the column line. Since the bipolar transistor which is approximately ten times higher in drive capability (smaller in ON resistance) than the MOS transistor is used for precharging, it is possible to make the time required for precharging extremely short.

Since the emitter of the sense circuit for reading data from the memory is directly or indirectly connected to the column line and the base of the sense circuit is connected to the sense amplifier bias circuit, it is possible to make efficient use of large gm of a bipolar transistor for detecting the column line voltage. Further, since the output voltage of the column line voltage setting circuit 10 is set nearly equal to that of the sense amplifier bias circuit 90, the precharge voltage is nearly equal to the detection voltage (threshold voltage) of the sense amplifier. Thus, a slight change in the column line voltage can be detected during the readout, resulting in readout at extremely high speed.

Although in the examples described before bipolar transistors are used as the first and second transistors, FET's can be used instead at a cost of slight degradation in performance.

In this case, the gate, source and drain of the FET may be used as the base which is a control electrode, emitter which is a reference electrode and the collector, respectively.

Figure 24:
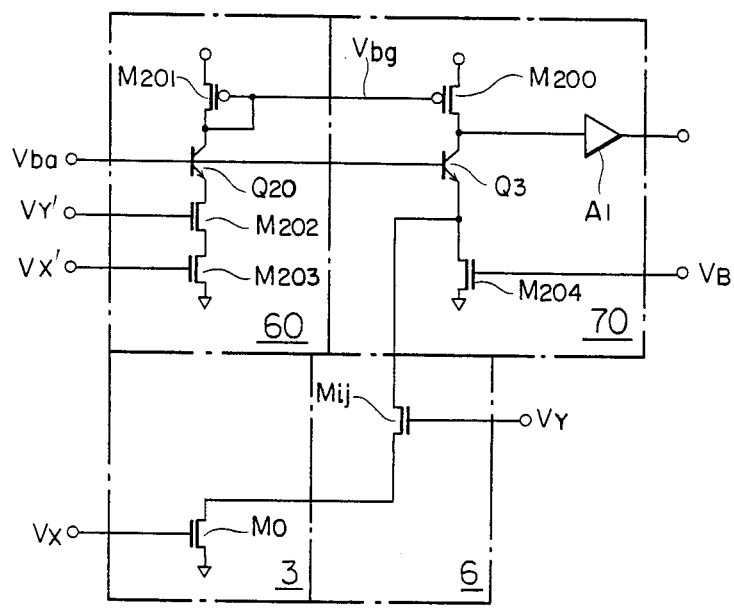

FIG. 24 shows another embodiment of the present invention. Reference letetrs in FIG. 24 that are like reference letteres in FIGS. 20, 21, 22 and 23 refer to like components.

In FIG. 24, the base of the second bipolar transistor $Q_3$ in the sense circuit 70 is connected to the AC ground. The emitter of the second bipolar transistor $Q_3$ is connected to a MOS transistor $M_{204}$ for biasing and a series circuit of a MOS transistor $M_{ij}$ for column line selection and a MOS transistor $M_o$ constituting a memory cell. The collector of the second bipolar transistor $Q_3$ is connected to a MOS transistor $M_{200}$ constituting the load impedance. A gate bias circuit 60 produces gate voltage $V_{bg}$ of the load MOS transistor $M_{200}$. A bipolar transistor $Q_{20}$ has a base connected in common to the base of the second bipolar transistor $Q_3$ in the sense circuit 70. A MOS transistor $M_{202}$ has the same size and conductivity type as those of the MOS transistor $M_{ij}$ in the Y selector circuit 6. A MOS transistor $M_{203}$ has the same size and conductivity type as those of the MOS transistor $M_o$ in the memory matrix. A MOS transistor $M_{201}$ has a gate connected in common to the gate of the load MOS transistor $M_{200}$ in the sense circuit 70 and has the same conductivity type as that of the load MOS transistor.

In the above described configuration, the same voltage $V_x'$ as the gate voltage $V_x$ of the MOS transistor $M_o$ in the memory matrix 3 during the ON time is applied to the gate of the MOS transistor $M_{203}$. And the same voltage $V_Y'$ as the gate voltage $V_Y$ of the MOS transistor $M_{ij}$ in the Y selector circuit 6 during the ON time is applied to the gate of the MOS transistor $M_{202}$. When the MOS transistor $M_{204}$ is in the OFF state, therefore, the base voltage and emitter circuit impedance of the bipolar transistor $Q_3$ are equal to those of the bipolar transistor $Q_{20}$. Hence, equal magnitude of collector currents flow through the bipolar transistors $Q_3$ and $Q_{20}$. The MOS transistor $M_{201}$ inserted in the collector circuit of the bipolar transistor $Q_{20}$ has the gate and drain connected together and constitutes a current mirror circuit in conjunction with the MOS transistor $M_{200}$.

Owing to the above described configuration, the load impedance of the second bipolar transistor $Q_3$ always matches with the impedance of the emitter circuit of that transistor. Even if the MOS transistor $M_o$ in the memory matrix 3 and the MOS transistor $M_{ij}$ in the Y selector circuit 6 vary in threshold voltage, mobility or the like due to the variation in process conditions, or even if the power supply voltage varies, it is thus possible to maintain always optimum load impedance.

In the foregoing description, the column line setting voltage was a predetermined function of base-emitter voltage $V_{BE}$ of a bipolar transistor. However, a predetermined function of threshold voltage $V_{th}$ of a MOS transistor may be used instead. The column line setting voltage is the minimum voltage applied to the control terminal, which is necessary for making a semiconductor switching element conductive. The voltage defined by a function of activation voltage peculiar to a general semiconductor switch may be used.

Owing to the present invention, a semiconductor memory with high speed and low power dissipation can be realized.

What is claimed is:

1. A semiconductor memory comprising:
   a plurality of of row lines;
   memory cells connected to said row lines and driven by selecting a row line;
   sense amplifiers connected to said memory cells via column lines; and
   a column line voltage setting circuit for setting a predetermined voltage on said column lines, said predetermined voltage being defined on the basis of the voltage necessary to activate semiconductor switch elements constituting said column line voltage setting circuit, and said predetermined voltage being substantially equal to a threshold voltage of said sense amplifiers,
   wherein each of said sense amplifiers includes a bipolar transistor having a collector connected to one power source voltage level through a load element, having a base connected to said one power source voltage level through a series circuit of an impedance element and a diode and having an emitter connected to another power source voltage level, wherein a diode is connected between a point where said impedance element and said diode are connected together and said collector, and wherein said base is uses as an input terminal of the sense amplifier.

2. A semiconductor memory according to claim 1, wherein said memory cell comprises a MOS transistor.

3. A semiconductor memory according to claim 4, wherein said impedance element comprises a MOS transistor of one conduction type, and the gate of said MOS transistor is connected to a first gate bias circuit which produces an output voltage for controlling the current of said MOS transistor in correlation with the current of an MOS transistor constituting one of said memory cells.

4. A semiconductor memory according to claim 3, wherein said first gate bias circuit includes:
   a first MOS transistor having the same size and conduction type as of a MOS transistor constituting one of said memory cells;
   a drain bias circuit for applying nearly the same voltage as said column line setting voltage to the drain of said first MOS transistor;
   a second gate bias circuit for applying nearly the same voltage as the voltage applied to said row line to the gate of said first MOS transistor; and
   a second MOS transistor of the second conduction type connected so as to let flow the drain current of said first MOS transistor through it, the gate and drain of said second MOS transistor being connected together, the drain of said second MOS transistor being used as the output terminal of said first gate bias circuit.

5. A semiconductor device comprising:
   a plurality of row lines;
   memory cells connected to said row lines and driven by selecting a row lines;
   a sense amplifier means, connected to at least one of said memory cells via a column line, including a first bipolar transistor having a collector connected to one power source voltage level through a load element, having a base connected to said memory cells and a sense amplifier bias circuit, and having an emitter connected to another power source voltage level; and
   a precharge circuit for charging a parasitic capacitance on said column line to a predetermined voltage, said precharge circuit including:
   a second bipolar transistor having a collector connected to said one power source voltage level, having a base, and having an emitter connected to said column line,
   a switching element connected between the base of said second bipolar transistor and said one power source voltage level, and
   a base bias means connected to the base of said second bipolar transistor for setting the base potential of said second bipolar transistor substantially equal to a voltage which is an integer times the base-emitter voltage of said second bipolar transistor
   wherein the output voltage of said sense amplifier bias circuit is substantially equal to that of said base bias means.

6. A semiconductor memory according to claim 5, wherein said precharge circuit and said sense amplifier bias circuit have a common reference voltage line.

7. A semiconductor memory device according to claim 5, wherein said sense amplifier bias circuit supplies a bias current to the base of said first bipolar transistor to turn on said first bipolar transistor.

8. A semiconductor memory according to claim 5, wherein said sense amplifier means and said precharge circuit are connected through an impedance element.

9. A semiconductor memory according to claim 8, wherein said impedance element comprises a field effect transistor for selectively connecting said column line to said sense amplifier means.

10. A semiconductor memory device comprising:
    a plurality of row lines;
    a plurality of memory cells controlled by a signal applied to said row lines;
    a sense amplifier means connected to at least one of said memory cells via a column line, including:
    a first bipolar transistor having a collector connected to one power source voltage level through a load element, having a base connected to said one power source voltage level through a series circuit of an impedance element and a first diode and having an emitter connected to another power source voltage level, wherein a second diode is connected between a node where said impedance element and said first diode are connected together and said collector, and wherein said base is used as an input terminal of said sense amplifier means; and
    a column line voltage setting circuit for setting a predetermined voltage on said column line, including a second bipolar transistor, said predetermined voltage being proportional to a base-emitter voltage of said second bipolar transistor, and said predetermined voltage being substantially equal to a threshold voltage of said sense amplifier means.

11. A semiconductor memory device comprising:
a plurality of row lines;
a plurality of memory cells controlled by a signal applied to said row lines;
a sense amplifier means connected to at least one of said memory cells via a column line, including:
- a first bipolar transistor having a collector connected to one power source voltage level through a load element, having a base connected to said at least one of said memory cells, and having an emitter connected to another power source voltage level, and
- a bias current supplying means connected to the base of said first bipolar transistor; and a column line voltage setting circuit for setting a predetermined voltage on said column line, including:
- a second bipolar transistor having a collector connected to said one power source voltage level, having a base, and having an emitter connected to said column line,
- a switching element connected between the base of said second bipolar transistor and said one power source voltage level, and
- a base bias means connected to the base of said second bipolar transistor for setting the base potential of said second bipolar transistor substantially equal to a voltage which is an integer times the base-emitter voltage of said second bipolar transistor, and wherein said predetermined voltage is substantially equal to a threshold voltage of said sense amplifier means.

12. A semiconductor memory device according to claim 11, wherein said bias current supplying means supplies a bias current to the base of said first bipolar transistor to turn on said first bipolar transistor.

* * * * *